United States Patent
Pessa et al.

(10) Patent No.: US 12,334,962 B2
(45) Date of Patent: Jun. 17, 2025

(54) RADIO-FREQUENCY MODULATOR APPARATUS

(71) Applicant: Nordic Semiconductor ASA, Trondheim (NO)

(72) Inventors: Marko Pessa, Oulu (FI); Sami Karvonen, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 361 days.

(21) Appl. No.: 17/925,287

(22) PCT Filed: May 13, 2021

(86) PCT No.: PCT/EP2021/062786
§ 371 (c)(1),
(2) Date: Nov. 14, 2022

(87) PCT Pub. No.: WO2021/229037
PCT Pub. Date: Nov. 18, 2021

(65) Prior Publication Data
US 2023/0223971 A1    Jul. 13, 2023

(30) Foreign Application Priority Data
May 15, 2020   (GB) ...................... 2007234

(51) Int. Cl.
*H04B 1/04*   (2006.01)
*H03D 7/12*   (2006.01)
(52) U.S. Cl.
CPC ............... *H04B 1/04* (2013.01); *H03D 7/125* (2013.01)
(58) Field of Classification Search
CPC ......... H04B 1/04; H04B 1/0475; H03D 7/125
(Continued)

(56) References Cited

U.S. PATENT DOCUMENTS 5,983,085 A * 11/1999 Zamat ...................... H04B 1/04
455/127.1
6,492,869 B1    12/2002 Kuriyama
(Continued)

FOREIGN PATENT DOCUMENTS

CN          110492890 A       11/2019

OTHER PUBLICATIONS

International Search Report and Written Opinion for PCT/EP2021/062786, mailed Aug. 20, 2021, 13 pages.
(Continued)

*Primary Examiner* — Don N Vo
(74) *Attorney, Agent, or Firm* — Klarquist Sparkman, LLP (57) ABSTRACT

A radio-frequency modulator apparatus comprises a baseband stage, a mixer stage and a radio-frequency stage. The baseband stage comprises: an input line for receiving an input current representative of a baseband input signal, a baseband transistor that passes some or all of the input current between a first and a second terminal thereof, an electrical connection between the input line and a control terminal of the baseband transistor, and an output line connected to said control terminal. The mixer stage receives a signal from the baseband stage and mixes it with a radio-frequency local-oscillator signal to generate a radio-frequency mixed signal. The radio-frequency stage receives the radio-frequency mixed signal, applies the radio-frequency mixed signal to a control terminal of a radio-frequency transistor causing it to pass a radio-frequency output current between a first and a second terminal thereof, and outputs the radio-frequency output current as an output signal.

20 Claims, 4 Drawing Sheets

(58) Field of Classification Search
USPC .......................................................... 455/91
See application file for complete search history.

(56) References Cited

U.S. PATENT DOCUMENTS

| | | | | |
|---|---|---|---|---|
| 7,107,030 | B1* | 9/2006 | Furmidge | H03C 1/36 |
| | | | | 455/249.1 |
| 7,260,368 | B1* | 8/2007 | Blumer | H03F 3/24 |
| | | | | 455/108 |
| 7,555,271 | B2 | 6/2009 | Peng | |
| 8,233,520 | B2* | 7/2012 | Wong | H03F 1/3241 |
| | | | | 375/221 |
| 9,838,047 | B2* | 12/2017 | Oliaei | H03F 1/32 |
| 2011/0235553 | A1* | 9/2011 | Andersson | H04B 1/525 |
| | | | | 455/114.2 |
| 2014/0184301 | A1 | 7/2014 | Ro | |
| 2019/0158036 | A1* | 5/2019 | Takenaka | H01L 23/66 |
| 2019/0379328 | A1 | 12/2019 | Li et al. | |

OTHER PUBLICATIONS

IPO Search Report under Section 17(5) for GB2007234.4, mailed Jul. 21, 2020, 3 pages.
Oliaei et al., "A Multiband Multimode Transmitter without Driver Amplifier," *2012 IEEE International Solid-State Circuits Conference / SESSION 9 / Wireless Transceiver Techniques / 9.2*, Feb. 21, 2012, 3 pages.

\* cited by examiner

RADIO-FREQUENCY MODULATOR APPARATUS

CROSS REFERENCE TO RELATED APPLICATIONS

This is the U.S. National Stage of International Application No. PCT/EP2021/062786, filed May 13, 2021, which was published in English under PCT Article 21(2), which in turn claims the benefit of Great Britain Application No. 2007234.4, filed May 15, 2020.

BACKGROUND OF THE INVENTION

This invention relates to a radio-frequency (RF) modulator apparatus.

RF modulators are used in radio transmitters to up-convert electrical baseband signals to radio frequencies. The resulting electrical RF signals can be passed to a suitable radio antenna for transmission as radio waves. The baseband signals may encode data using one or more of phase, frequency and amplitude modulation—e.g. using phase-shift keying (PSK) or frequency-shift keying (FSK).

The RF modulator mixes the baseband signal with a periodic signal generated by a local oscillator (LO) at an RF carrier frequency. The mixing process is intentionally non-linear, so that it generates sum and difference components at radio frequencies that depend on the input signal. However, apart from this desired mixing effect, it is desirable that an RF modulation apparatus be as linear as possible, so that it generates minimal intermodulation distortion that could otherwise result in out-of-band transmissions.

It is known to implement a highly linear transmitter using an 8-phase mixer, to try to reduce 3rd and 5th order RF harmonics at the output of the mixer output, which should in turn reduce the $3^{rd}$ and $5^{th}$ order counter intermodulation products CIM3 and CIM5 generated at the RF amplifier stage input. However, the use of an 8-phase mixer results in significant complexity, current consumption and die area.

The present invention provides a novel RF modulator design that can provide high linearity without requiring the use of such a complex mixer.

SUMMARY OF THE INVENTION

From a first aspect, the invention provides a radio-frequency modulator apparatus comprising:
  a baseband stage;
  a mixer stage; and
  a radio-frequency stage,
  wherein the baseband stage comprises:
  an input line for receiving an input current representative of a baseband input signal;
  a baseband transistor arranged to pass some or all of the input current between a first terminal and a second terminal of the baseband transistor;
  an electrical connection between the input line and a control terminal of the baseband transistor; and
  an output line connected to the control terminal of the baseband transistor;
  wherein the mixer stage:
  is arranged to receive a signal from the output line of the baseband stage; and
  is configured to mix the received signal with a radio-frequency local-oscillator signal to generate a radio-frequency mixed signal; and
  wherein the radio-frequency stage:
  is arranged to receive the radio-frequency mixed signal from the mixer stage;
  comprises a radio-frequency transistor;
  is configured to apply the radio-frequency mixed signal to a control terminal of the radio-frequency transistor so as to cause the radio-frequency transistor to pass a radio-frequency output current between a first terminal and a second terminal of the radio-frequency transistor; and
  comprises an output line for outputting the radio-frequency output current as a radio-frequency output signal.

From a second aspect, the invention provides a radio transmitter apparatus comprising such a radio-frequency modulator apparatus.

Thus it will be seen that, in accordance with the invention, the control terminal of a first, closed-loop (e.g. diode-connected) transistor in the baseband stage is electrically coupled, via an up-converting mixer stage, to the control terminal of a second transistor that controls the flow of current in the RF output signal. This arrangement can effectively operate as a current mirror, with the whole modulator being a current mirror, spanning across the mixer stage. The baseband transistor acts as the diode-connected input transistor of the current mirror, while the RF transistor acts as a mirroring output transistor.

This design has been found capable of providing highly linear behaviour, by providing analog pre-distortion through the current mirror linearization principle, even with a relatively simple passive mixer, such as a 4-phase passive mixer. The modulator need not require a large area when implemented as an integrated circuit, e.g. on a single silicon chip, and may have a low current consumption.

In one set of embodiments, the baseband and radio-frequency transistors are field-effect transistors (FETs); the first and seconds terminals are drains and sources, and the control terminals are gates. In another set of embodiments, the baseband and radio-frequency transistors are bipolar transistors; the first and second terminals are collectors and emitters, and the control terminals are bases.

The baseband transistor may be identical or similar to the RF transistor. This can provide accurate current mirroring performance across the modulator. They may have the same voltage or current gain. In some embodiments the baseband and RF transistors are both FET transistors, e.g. both being MOS transistors such as NMOS transistors. They may have the same gate width and/or gate length and/or oxide thickness and/or threshold voltage. In embodiments in which the baseband and RF transistors are both bipolar junction transistors (BJTs), they may have the same base thickness and/or collector-base junction area and/or emitter-base junction area. The "same" here preferably means identical, at least within fabrication tolerances. This is because good linearity may be achieved when using exactly similar baseband and RF transistors. However, in some embodiments, the "same" may mean within 5% or 10%. If the transistors are not similar, analog predistortion may occur in the baseband stage that will not be properly cancelled in the RF stage part, resulting in less linear mixing results.

The baseband stage may comprise a plurality of baseband transistors, together arranged to pass some or all of the input current, e.g. a bank of transistors arranged in parallel. A respective control terminal of each of this set of baseband transistors may be connected to the input line. Additionally or alternatively, the RF stage may comprise a plurality of RF transistors, together arranged to pass a radio-frequency output current, e.g. a bank of transistors arranged in parallel.

A respective control terminal of each of this set of RF transistors may be arranged to receive the radio-frequency mixed signal. The individual baseband and RF transistors in the respective sets may all be the same—i.e. with both sets of transistors being built using the same unit elements. This can allow some embodiments of the RF modulator to provide a predictable gain to the mirrored current, rather than uniformly mirroring the input current. By using the same unit transistors in both sets, the gain may conveniently be determined as the ratio of the number of active transistors in each set. The baseband stage may comprise one or more switches for switchably enabling and disabling one or more of the plurality of baseband transistors (i.e. for connecting it in and out of the current path). The radio-frequency modulator apparatus may provide an interface (e.g. a register interface which may be accessible to a processor over a bus) for controlling how many of the plurality of baseband transistors are enabled. Additionally or alternatively, the RF stage may comprise one or more switches for switchably enabling and disabling one or more of the plurality of RF transistors. The radio-frequency modulator apparatus may provide an interface (e.g. a register interface) for controlling how many of the plurality of radio-frequency transistors are enabled. This can allow the level of gain to be controlled programmatically. In some embodiments, the gain may be selectable between a set of values which may comprise one or more of: unity, one or more values greater than one (i.e. amplification), and one or more fractional values (i.e. attenuation). This can allow the RF modulator to support a wide gain control range, making it well suited for use with radio protocols such as LTE (Long-Term Evolution). In some embodiments, the values are rational numbers.

The baseband transistor may be an element of a baseband transconductance ($G_m$) cell. The baseband $G_m$ cell may connect the baseband transistor to ground through a resistive element, to provide resistive degeneration. The RF transistor may be an element of an RF transconductance ($G_m$) cell. The RF $G_m$ cell may connect the RF transistor to ground through a resistive element, to provide resistive degeneration. Each resistive element may be a dedicated element such as a resistor or a MOS transistor biased on linear (triode) region, or it may be provided in conjunction with another features, such as a resistive enable switch (i.e. a switch for enabling a $G_m$ cell in which a resistance is incorporated into the switch).

The electrical connection between the input line and a control terminal of the baseband transistor could be a direct connection, but in a preferred set of embodiments the connection comprises an amplifier. The amplifier may be a voltage amplifier, such as an operational amplifier. The amplifier may thus close the loop of the baseband transistor. An amplifier can ensure there is only a small impedance for the input current entering the baseband stage, so that it is easier to obtain high linearity in the circuitry driving the baseband current. An amplifier may, due to its buffering capability, help avoid cross talk between an in-phase section and a quadrature section of the baseband section (so-called tilt), and may ensure good gain in the mixer stage.

The amplifier may have a first input connected to the input line and an output connected to the control terminal of the baseband transistor. It may have a second input (e.g. a differential input) for connection to a reference voltage. The reference voltage may define the voltage at the input line. The amplifier may be configured to drive the control terminal of the baseband transistor to such a voltage that all the input current from the input line is sunk by the baseband transistor, or by a set of baseband transistors.

Because the control terminal of the baseband transistor is also connected to the mixer, the amplifier may also drive the mixer stage, as well as driving the baseband transistor. The amplifier output can thus present the predistorted voltage waveform that is needed to produce a similar highly linear current when driven to the RF transistor (on the mirroring side of the current mirror). The presence of the mixer stage between the diode-connected baseband transistor and the mirroring RF transistor of the current mirror can enable an input current having highly linear baseband content to be transferred to RF while maintaining high linearity.

The amplifier may help to compensate for capacitive losses between the baseband and RF transistors. It can also decrease the impedance seen by a current source providing the input current to the input line, within a bandwidth of the amplifier. A smaller impedance can alleviate requirements for the driving block and enable high linearity in the current source.

The baseband stage may comprise a capacitor connected to the output line. The capacitor may be arranged to provide transient currents to the output line. This can be useful to prevent the voltage on the output line dropping during fast switching within the mixer and RF stages, when the bandwidth of the amplifier may prevent the amplifier from being able to react sufficiently fast to transients during the switching operation.

The RF modulator may be a differential modulator. The baseband stage may comprise a pair of input lines for receiving a differential input current and a pair of output lines for outputting a differential output signal to the mixer stage. It may comprise a respective baseband transistor and optionally a respective amplifier connected to each input line. It may comprise a respective capacitor connected to each output line.

The RF modulator may be a quadrature modulator. The baseband stage may comprise an in-phase section and a quadrature section. The two sections may be identical. Each section may comprise a baseband transistor and an amplifier. Each section may comprise a pair of baseband transistors and a pair of amplifiers when configured to receive differential input signals.

The mixer may be a passive mixer. It may be a voltage mixer. It may be a quadrature mixer. It may be a four-phase mixer, although it could be a two-phase mixer or a mixer using a higher number of phases.

In some embodiments, the baseband stage may comprise one or more filters for filtering the input signal. The filtering may be provided on the input line, before the baseband transistor, or it may be provided around an amplifier.

The RF modulator may be configured to operate at gigahertz frequencies—e.g. receiving a local-oscillator signal at around 2.4 GHz.

The RF stage may be an RF amplifier stage. The RF transistor, or a set of connected RF transistors, may provide amplification or attenuation of the current, e.g. by having a different effective gate area (when using FETs), or a different effective base-emitter and base-collector area (when using BJTs), from the baseband transistor. In some embodiments, the gain of the modulator may be an integer or a rational number; this may be achieved by providing an integer ratio of identical transistors in the baseband and RF stages.

The modulator may be implemented as an integrated circuit (IC) device, such as on a system-on-chip (SoC).

The radio transmitter apparatus may comprise a power amplifier connected to the output line of the RF stage. The transmitter apparatus may comprise an antenna connected, directly or indirectly, to the output line. The apparatus may comprise any one or more of: a power supply, such as a battery; one or more processors for generating the baseband input signal; a crystal oscillator, e.g. for generating the local-oscillator signal or signals; a user interface; discrete components; integrated components; etc.

The radio modulator may be suitable for modulating LTE (Long-Term Evolution) signals and/or Bluetooth™ signals, such as Bluetooth Low Energy™ signals, and/or any other radio signals, for radio transmission. The radio transmitter apparatus may comprise a LTE (Long-Term Evolution) radio transmitter.

References herein to a circuit may encompass both open and closed circuit portions—i.e. not necessarily connected to a power supply.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain preferred embodiments of the invention will now be described, by way of example only, with reference to the accompanying drawings, in which.

DETAILED DESCRIPTION

Figure 1:
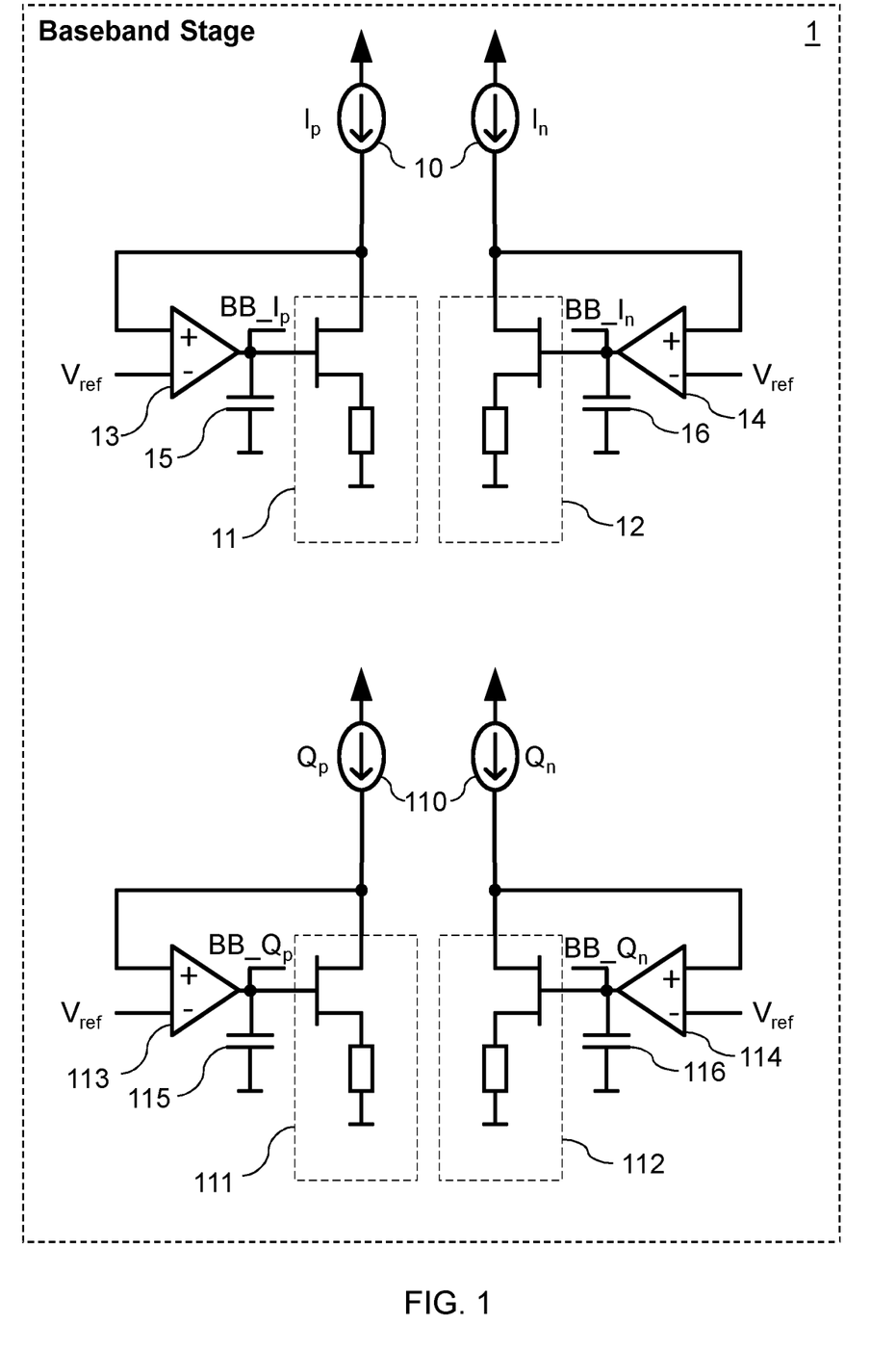
FIG. 1 is a circuit diagram of a baseband stage of a differential quadrature RF transmitter modulator embodying the invention.
Figure 2:
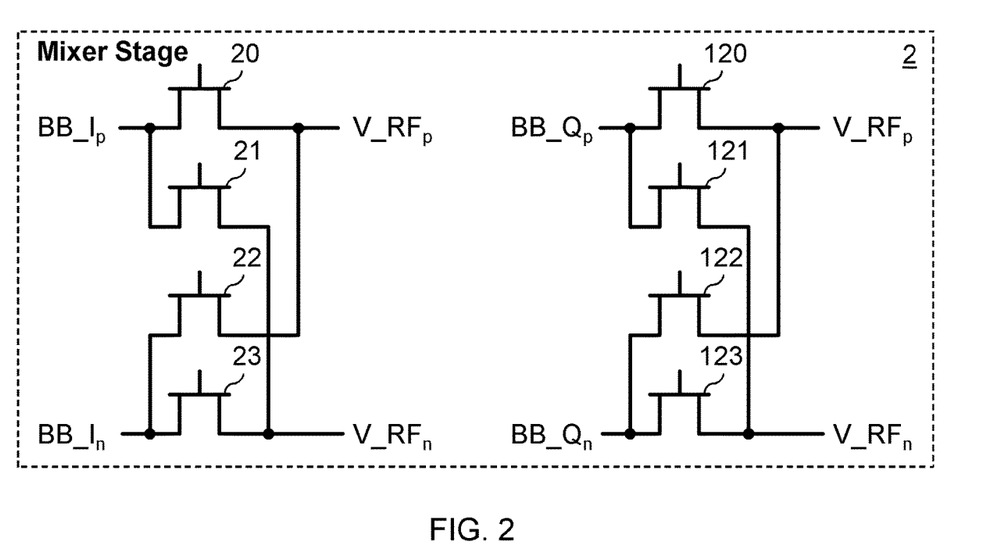
FIG. 2 is a circuit diagram of a passive mixer stage of the differential quadrature RF transmitter modulator.
Figure 3:
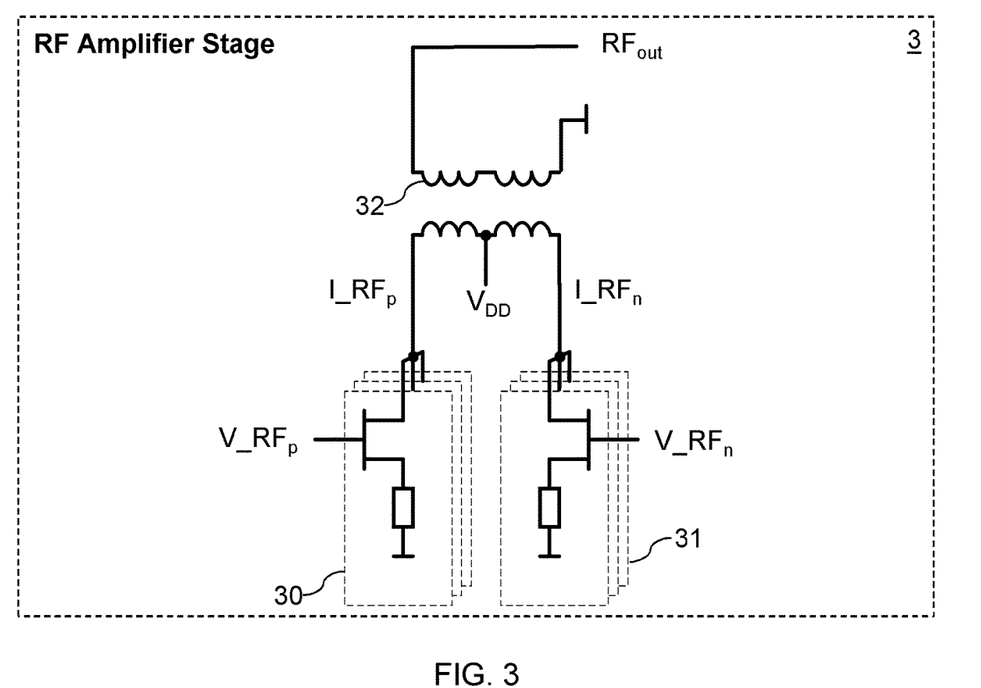
FIG. 3 is a circuit diagram of an RF amplifier stage of the differential quadrature RF transmitter modulator.

FIGS. 1-3 show a differential quadrature RF transmitter modulator circuit 1-3 embodying the invention.

The baseband (BB) stage 1, shown in FIG. 1, which outputs differential baseband signals $BB\_I_n$, $BB\_I_p$, $BB\_Q_n$, $BB\_Q_p$ to a four-phase passive mixer stage 2, shown in FIG. 2. The mixer stage 2 outputs differential radio-frequency signals $V\_RF_p$, $V\_RF_n$ to an RF amplifier stage 3, shown in FIG. 3.

The whole RF modulator circuit may be implemented in silicon. It may form part of a larger circuit, such as a CMOS radio-on-a-chip device, which may comprise one or more processors, memory, buses, etc. It may be part of an LTE (Long-Term Evolution) integrated-circuit chip, or a Bluetooth Low Energy™ integrated-circuit chip. The modulator may be part of a larger electronic apparatus, such as a networked sensor device, e.g. being connected to a power supply, external antenna, etc.

Figure 4:
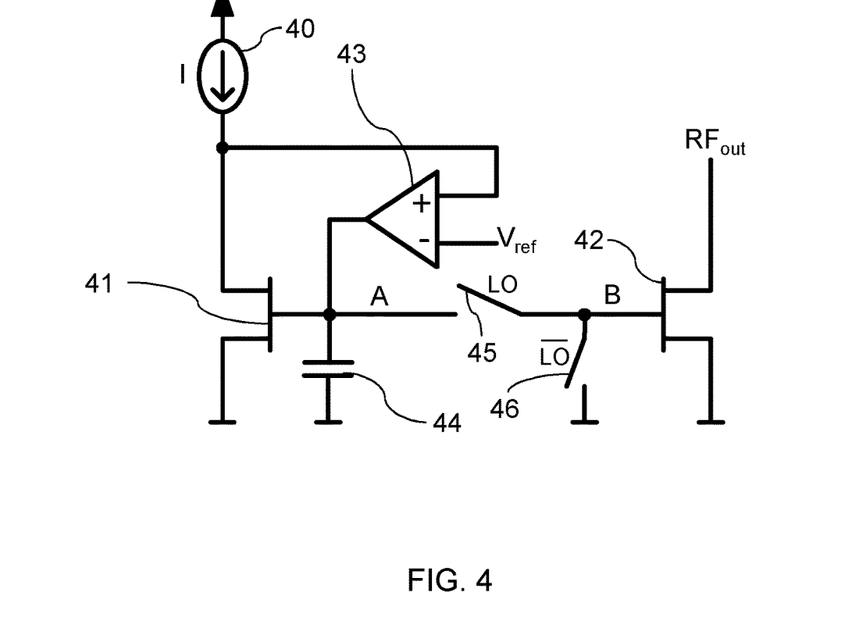
FIG. 4 is a circuit diagram of a single-ended RF transmitter modulator embodying the invention.

Before describing the detailed differential quadrature (IQ) implementation of FIGS. 1-3 in detail, it is useful to consider FIG. 4 first, which shows a simpler, single-ended embodiment, which nonetheless operates on the same underlying principles.

The RF transmitter modulators of FIG. 4 and of FIG. 1-3 both operate using a buffered current-mirror concept, in which the baseband and RF amplifier stages together act as a current mirror, straddling an RF mixer stage, so as to cause the current of the baseband input signal to be mirrored (identically or with amplification or fractional gain) in the RF output of the RF amplifier stage.

In FIG. 4, an analogue input signal is provided by a current source 40. This signal may encode binary data for transmission by a radio. An NMOS "baseband" or "diode-connected" transistor 41, an NMOS "radio-frequency" or "mirror" transistor 42, and an operational amplifier 43 together act as a current mirror. The diode-connected transistor 41 is connected in a closed loop configuration through the op amp 43. The op amp 43 can drive the diode device gate of the diode-connected transistor 41 to such a voltage that all the input current I from the current source 40 is sunk by the diode transistor 41.

Although the exemplary embodiments described here employ field-effect transistors, it will be appreciated that, in alternative embodiments, bipolar transistors may be used instead.

First, consider the case when the series switch 45 between the two transistors 41, 42 is closed, and the grounding switch 46 is open, such that the voltages at points A and B are equal (i.e. having a common node voltage).

The output of the current mirror circuit of FIG. 4 will be equal to the input current multiplied by the gate area of the mirror transistor 42, divided by the gate area of the diode-connected transistor 41. The mirror transistor 42 and diode-connected transistor 41 will typically have the same channel length, L, and so the current gain will be proportional to the ratio of their respective gate widths, W. The mirror transistor 42 may be equal to the diode-connected transistor 41, or it may be larger—e.g. having a gate area that is an integer multiple of times larger—such that the modulator amplifies the input signal at the RF output, or it could be smaller, so that the modulator provides fractional gain.

If mirroring a direct current (DC) source, the op amp 43 would help to compensate for potential leakage currents in the gates of the transistor 41, 42 gates. However, the op amp 43 has a more significant role when, as here, it is used in mirroring an alternating current (AC) signal. In this case, the op amp 42 will compensate for capacitive losses taking place at the node between the two transistors 41, 42. The bigger the devices—both the diode-connected transistor 41 and the mirror transistor 42—the more capacitive loading there will be in the node. Additionally, as the op amp 43 closes the diode loop, it effectively decreases the impedance seen by the input current source 40 within the op amp 43 bandwidth. A smaller impedance alleviates requirements for the driving block and enables high linearity in the current source design.

The diode-connected transistor 41 does not have a linear transfer function from gate-to-source voltage (Vgs) to drain current (Id) since the driving input source is current. If the input current source 40 drives a perfectly sinusoidal signal, i.e. without harmonic content, the node voltage at point A (which equals B) will be a predistorted voltage and, when driven to a similar device as the diode-connected transistor 41, such as the mirror transistor 42, the output of the similar device will be close to perfectly linear. In this buffered current mirror arrangement, the output current will be a very close replica of the input current, I, only scaled in magnitude. In practice, the characteristics of the op amp 43, such as bandwidth and DC-gain, will determine how well the AC output current mimics the AC input current.

Now consider the switches 45, 46 located at the node between the diode-connected transistor 41 and the mirror transistor 42. When open, the series switch 45 disconnects the gate of the mirror transistor 42 from the diode-connected transistor 41 and the op amp 43, while the grounding switch 46, when closed, connects the gate of the mirror transistor 42 to ground. The switches 45, 46 are configured always to be in opposite states from each other. In use, their states are toggled at a radio frequency (e.g. 2.4 GHz), under the control of a local oscillator (LO) (not shown). In this way, a baseband input signal, I, can be mixed up to a radio-frequency band, centred around the switching frequency of the LO.

The gate is discharged by the grounding switch 46 when the series switch 45 is non-conducting. The effective load of the mirror transistor 42 therefore increases as the switching frequency increases, because the gate capacitance needs to be charged on every transition (i.e. every time the series switch 45 closes). However, the op amp 43 can provide the average current that is required due to this switching operation, even at high frequencies. The bandwidth (BW) of the op amp 43 is limited, so it reacts slowly to transients during the switching operation; however the capacitor 44 can supply the necessary transient currents to enable fast switching of the mirror transistor 42.

Now consider FIGS. 1-3, which use this same mirroring concept, but implement it in a differential, IQ modulator circuit.

FIG. 1 shows a baseband (BB) stage 1 that offers high linearity. This baseband stage 1 is connected to the RF amplifier stage 3 via the mixer stage 2, shown in FIGS. 2 & 3.

The baseband stage 1 has an in-phase (I) section, which receives a differential (p & n) in-phase (I) current signal from an in-phase differential signal source 10, and an identical quadrature-phase (Q) section, which receives a differential (p & n) quadrature (Q) current signal from a quadrature differential signal source 110. The baseband stage 1 may be connected to any suitable source, which may be external to the RF modulator. It may, for instance, be connected to a digital baseband stage that provides I & Q signals to the baseband stage 1 through respective digital-to-analog converters (DAC) (not shown). The digital baseband stage may have generated the I & Q signals by encoding digital data received from a processor or other source. Filtering may optionally be provided before the current sources 10, 110.

The in-phase section provides very linear positive (p) and negative (n) differential IQ currents, $I_p$, $I_n$, to respective closed-loop diode-connected transconductance ($G_m$) cells 11, 12. Each $G_m$ cell 11, 12 contains a respective NMOS transistor. Each Gm cell 11, 12 may additionally contain a resistor to ground, to implement resistive degeneration. These resistors are not essential, but may help provide improved linearity and/or better matching with the RF amplifier. The $G_m$ cells 11, 12 may optionally comprise a bank of multiple $G_m$ cells connected in parallel. Each $G_m$ cell in the bank may have a respective enable switch device, e.g. comprising an enable transistor (not shown). This can allow the overall gate area of the diode-connected transistors 11, 12 to be controlled programmatically. These $G_m$ cells (or banks of $G_m$ cells) 11, 12 serve the same role as the diode-connected transistor 41 in the single-ended design of FIG. 4.

A pair of op amps 13, 14 correspond to the op amp 43 of FIG. 4, while a pair of capacitors 15, 16 correspond to the capacitor 44 of FIG. 4. The outputs of the op amps 13, 14, supported by the capacitors 15, 16, are passed to the mixer stage 2, as baseband signals $BB\_I_p$, $BB\_I_n$, for driving IQ-modulator switches 20-23 in the mixer stage 2. These in turn drive the RF amplifier 3.

The quadrature section similarly contains a pair of op amps 113, 114 arranged to close the loop of respective $G_m$ cells or banks of $G_m$ cells 111, 112. A pair of capacitors 115, 116 provide transient current support for the quadrature-phase output signals $BB\_Q_p$ and $BB\_Q_n$, which are provided to the IQ-modulator switches 120-123 in the mixer stage 2.

FIG. 2 shows the mixer stage 2, which comprises a passive voltage mixer. It comprises separate I & Q sections, each of which receives inputs from a four-phase local oscillator (LO) (not shown) which oscillates at a radio frequency (e.g. around 2.4 GHz). The four-phase LO signals are applied to the gates of four transistors 20, 21, 22, 23 in the I section, and to the gates of a set of four transistors 120, 121, 122, 123 in the Q section. The transistors 20-23 & 120-123 mix the baseband and LO signals to generate differential RF outputs. The I and Q outputs are combined at the output of the mixer stage 2 to give a single differential RF signal $V\_RF_p$, $V\_RF_n$, which is passed to the RF amplifier 3.

The mixer stage 2 switches the outputs of different ones of the baseband op amps 13, 14, 113, 114 to the input of the RF amplifier stage 3 at different times. Thus the input parasitic capacitance of the RF amplifier stage 3 is charged to a new voltage each time the mixer switches 20-23, 120-123 are toggled. Charging is done by the op amps 13, 14, 113, 114 but also by the op-amp output capacitors 15, 16, 115, 116.

FIG. 3 shows the RF amplifier stage 3, which directs the differential RF signal components $V\_RF_p$, $V\_RF_n$ into respective sets of transconductance ($G_m$) cells 30, 31, each set containing one or more $G_m$ cells connected in parallel, with each $G_m$ cell being sized similarly or identically to the individual $G_m$ cells in the baseband stage 1. These produce an amplified differential output current $I\_RF_p$, $I\_RF_n$. In some embodiments, this could be output as a differential signal—e.g. to an inductor or resistor to positive power supply on both the p & n output branches. The differential output could be provided to a differential power amplifier. However, in the present embodiment, the output current $I\_RF_p$, $I\_RF_n$ is passed through a balun 32 to generate a single-ended RF signal, $RF_{out}$. This $RF_{out}$ can then be connected to a suitable on-chip or off-chip radio antenna (not shown) for transmission, e.g. via an optional filtering section to a suitable power amplifier stage (not shown).

Each transistor in the $G_m$ cells 30, 31 in the RF amplifier stage 3 is similar to each transistor in the $G_m$ cells 11, 12, 111, 112 in the baseband stage 1—i.e. having identical or similar gate widths, lengths and thicknesses, and identical or similar threshold voltages.

The number of the active $G_m$ cells 11, 12, 111, 112 in the baseband stage 1 and/or the number of the active $G_m$ cells 30, 31 in the RF amplifier stage 3 may, in some embodiments, be variable, e.g. controlled with the help of enable switches (not shown in FIG. 1 or 3). This can be useful for controlling the gain of the RF modulator, which will depend on the relative number of active $G_m$ cells 30, 31 in the RF amplifier stage 3 compared with the number of active $G_m$ cells 11, 12, 111, 112 in the baseband stage 1. The RF transmitter modulator 1-3 may comprise a register interface and suitable control circuitry (not shown) that can be written to over a data bus (e.g. by a processor) for controlling how many of the plurality of baseband-stage and/or amplifier-stage transistors are enabled.

The output of the op-amps 13, 14, 113, 114 in the baseband stage 1 presents a predistorted voltage that is needed to sink very linear baseband currents ($I_p$, $I_n$, $Q_p$, $Q_n$). The same voltage waveforms are applied to the RF amplifier stage 3 inputs in pieces due to switching. Therefore, the $G_m$ cells 30, 31 in the RF amplifier stage 3 produce a highly linear output current, but at radio frequency. Thus, use of the baseband stage 1 in combination with the mixer and RF amplifier stages 2, 3 preserves the inherent linearity of a current mirror across the baseband-to-RF frequency translation.

Figure 5:
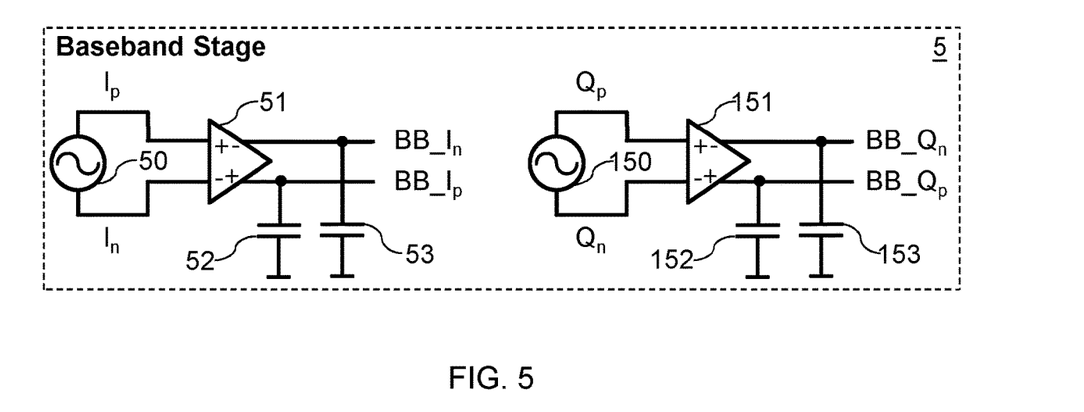
FIG. 5 is a circuit diagram of a baseband stage based on conventional design principles.
Figure 6:
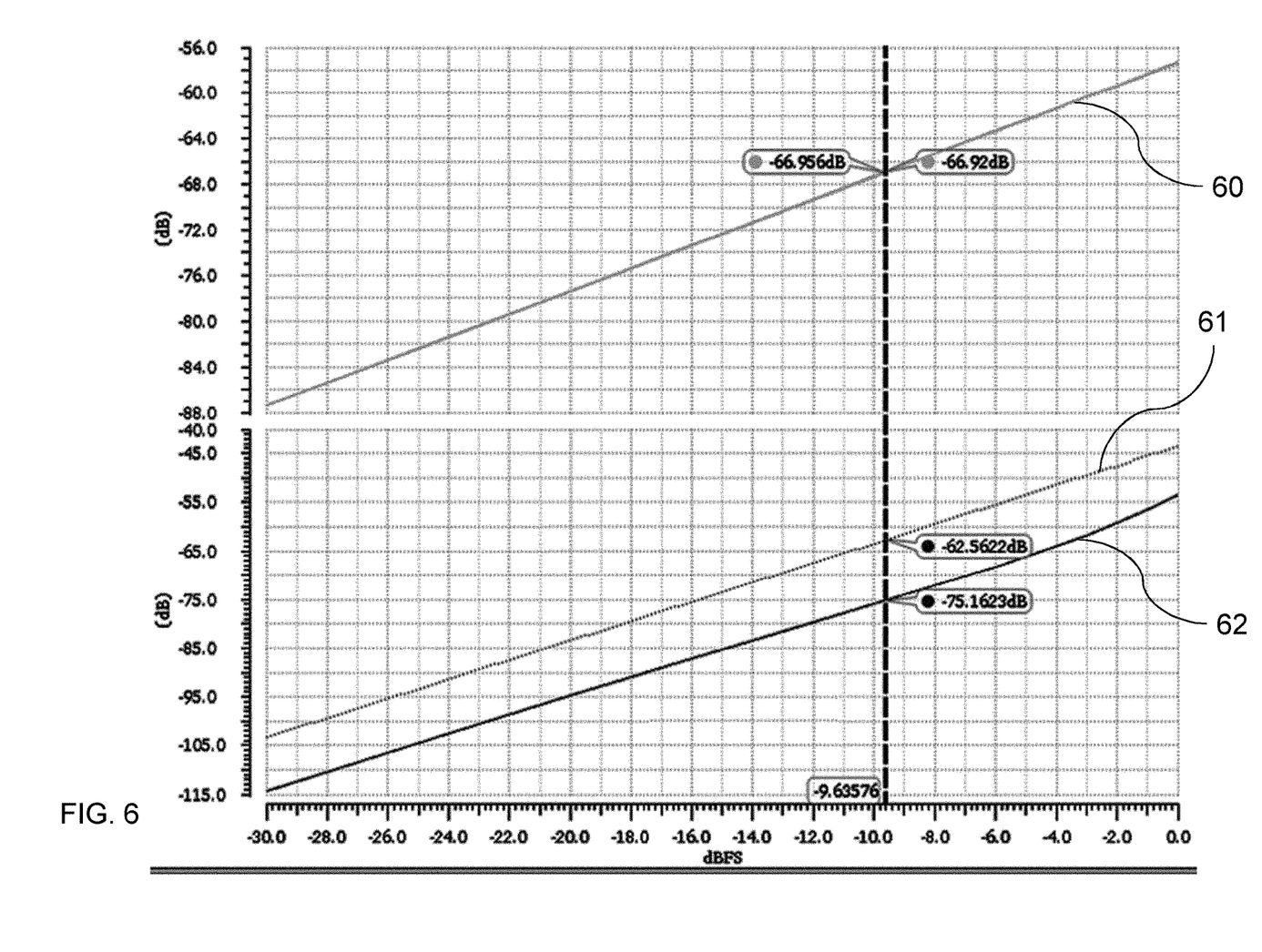
FIG. 6 is graph of output current and of $3^{rd}$ order counter intermodulation products (CIM3) against baseband level, comparing a conventional design with an RF transmitter modulator embodying the invention.

This can be seen by contrasting the novel baseband stage 1 with a simpler design as shown in FIG. 5. The graphs in FIG. 6 illustrate the performance difference between an embodiment of the invention and a simpler design.

FIG. 5 shows a basic baseband stage 5 that has an in-phase (I) section, fed by a differential in-phase (I) signal source 50, and a quadrature-phase (Q) section, fed by a differential quadrature-phase (Q) signal source 150. The in-phase section has a differential-output op-amp 51 that outputs an amplified or buffered differential baseband signal $BB\_I_n$, $BB\_I_p$. Each output lead is connected to a respective capacitor 52, 53, which can supply additional transient currents to the mixer stage 2 when required. The quadrature (Q) section is similarly arranged, with a differential-output op-amp 151 that outputs an amplified differential baseband signal $BB\_Q_n$, $BB\_Q_p$, supported by two capacitors 152, 153.

The baseband stage 5 could be connected to a mixer stage and RF amplifier stage similar to those shown in FIGS. 2 and 3, albeit with a need for AC coupling caps between the mixer and the RF amplifier stage, and separate biasing for the RF amplifier stage.

However, such a modulator would be expected to have sub-optimal linearity, even when using a highly linear voltage source 50, 150 in the baseband stage 5. The baseband harmonics modulated around the LO harmonics would be relatively high, leading to significant CIM (counter intermodulation) products and ACPR (adjacent channel power ratio).

By contrast, the novel baseband stage 1 of FIG. 1 can have significantly lower undesirable counter intermodulation products (CIM) and intermodulation distortion (IMD) products. Nevertheless, the complexity of the baseband stage 1 is at about the same level as for a simple voltage-mode passive mixer IQ-modulator, and is substantially less than that of an 8-phase modulator. Current consumption is also very reasonable.

FIG. 6 shows simulated results that compare the 3rd order CIM (CIM3) products, as the baseband level is swept, between i) an RF modulator having a simple voltage-mode driven design with a baseband stage 5 similar to that shown in FIG. 5, and ii) a novel RF modulator implemented using the current-mirroring approach disclosed herein.

The top curve 60 plots the output current of the RF amplifier for both designs; it is almost identical for both designs, so appears as a single line. This shows that both modulators provide the same output level and so it is feasible to compare their linearity.

The two lower curves 61, 62 show the respective CIM3 products. The higher of the two lower curves 61 relates to the conventional design, while the lower curve 62 relates to the new design. It can be seen that the new design improves the CIM3 by about 13 dB at corresponding output power levels.

In addition to these linearity improvement, the new design offers additional options for gain control, because the current mirroring ratio can be adjusted by changing the number of active $G_m$ cells in the baseband stage 1—e.g. by switching additional $G_m$ cells in or out of the circuit. Activating more $G_m$ cells at the baseband stage 1 reduces the current mirroring ratio and decreases gain, while decreasing the number of active $G_m$ cells at the baseband stage 1 increases the current mirroring ratio and increases the gain.

The $G_m$ cells in the RF amplifier 3 operate at radio frequencies, they are preferably small in size in order to have small parasitics. Consequently, the $G_m$ cells 11, 12, 111, 112 in the baseband stage 1 are preferably small in size also.

Having small devices may make the design susceptible to mismatch effects. When there is mismatch, there will be DC offset voltages between $BB\_I_p$ and $BB\_I_n$, and between $BB\_Q_p$ and $BB\_Q_n$. DC offset voltages may lead to carrier leakage or local oscillator feedthrough (LOFT) at the output of the RF amplifier 3. This may be mitigated, at least in some embodiments, by providing DC-offset calibration or compensation, using any appropriate technique. Offsets may occur due to baseband stage mismatches, and compensation method can take place at the baseband stage 1. Mismatches at the RF amplifier stage 3 do not transfer to RF but are visible only at DC currents. If, as in some embodiments, a current-mode mixer is used, the offset may be calibrated for each gain step separately, although the level of the carrier leakage may be smaller to begin with.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A radio-frequency modulator apparatus comprising:
a baseband stage;
a mixer stage; and
a radio-frequency stage,
wherein the baseband stage comprises:
an input line for receiving an input current representative of a baseband input signal;
a baseband transistor arranged to pass some or all of the input current between a first terminal and a second terminal of the baseband transistor;
an electrical connection between the input line and a control terminal of the baseband transistor; and
an output line connected to the control terminal of the baseband transistor;
wherein the mixer stage:
is arranged to receive a signal from the output line of the baseband stage; and
is configured to mix the received signal with a radio-frequency local-oscillator signal to generate a radio-frequency mixed signal; and
wherein the radio-frequency stage:
is arranged to receive the radio-frequency mixed signal from the mixer stage;
comprises a radio-frequency transistor;
is configured to apply the radio-frequency mixed signal to a control terminal of the radio-frequency transistor so as to cause the radio-frequency transistor to pass a radio-frequency output current between a first terminal and a second terminal of the radio-frequency transistor; and
comprises an output line for outputting the radio-frequency output current as a radio-frequency output signal.

2. The radio-frequency modulator apparatus of claim 1, wherein the baseband stage, mixer stage and radio-frequency stage are integrated on a single silicon chip.

3. The radio-frequency modulator apparatus of claim 1, wherein the baseband and radio-frequency transistors are field-effect transistors, the first and second terminals are drain and source terminals, and the control terminals are gate terminals.

4. The radio-frequency modulator apparatus of claim 3, wherein the baseband transistor has the same gate width and gate length as the radio-frequency transistor.

5. The radio-frequency modulator apparatus of claim 1, wherein the baseband transistor is an element of a baseband transconductance cell, and wherein the baseband transconductance cell comprises a resistive element for connecting the baseband transistor to ground to provide resistive degeneration.

6. The radio-frequency modulator apparatus of claim 1, wherein the baseband stage comprises a set of baseband transistors, the set comprising said baseband transistor and one or more further baseband transistors arranged in parallel with the baseband transistor, wherein a respective control terminal of each of the set of baseband transistors is connected to the input line.

7. The radio-frequency modulator apparatus of claim 6, wherein the baseband stage comprises one or more switches for switchably enabling and disabling one or more of the set of baseband transistors.

8. The radio-frequency modulator apparatus of claim 1, wherein the radio-frequency transistor is an element of a radio-frequency transconductance cell, and wherein the radio-frequency transconductance cell comprises a resistive element for connecting the radio-frequency transistor to ground to provide resistive degeneration.

9. The radio-frequency modulator apparatus of claim 1, wherein the radio-frequency stage comprises a set of radio-frequency transistors, the set comprising one or more further radio-frequency transistors arranged in parallel with the radio-frequency transistor, wherein a respective control terminal of each of the set of radio-frequency transistors is arranged to receive the radio-frequency mixed signal.

10. The radio-frequency modulator apparatus of claim 9, wherein the radio-frequency stage comprises one or more switches for switchably enabling and disabling one or more of the set of radio-frequency transistors.

11. The radio-frequency modulator apparatus of claim 1, wherein:
the baseband stage comprises a plurality of baseband transistors;
the radio-frequency stage comprises a plurality of radio-frequency transistors; and
each transistor of the plurality of baseband transistors and of the plurality of radio-frequency transistors is a field-effect transistor, wherein all the field-effect transistors have the same gate area.

12. The radio-frequency modulator apparatus of claim 11, wherein the radio-frequency modulator apparatus provides an interface for controlling how many of the plurality of baseband transistors are enabled to pass the input current and/or for controlling how many of the radio-frequency transistors are enabled to pass the radio-frequency output current.

13. The radio-frequency modulator apparatus of claim 1, configured or controllable to provide a gain, from the input current to the radio-frequency output current, that is a rational number.

14. The radio-frequency modulator apparatus of claim 1, wherein the electrical connection between the input line and a gate of the baseband transistor comprises an amplifier.

15. The radio-frequency modulator apparatus of claim 14, wherein the amplifier is configured to drive the gate of the baseband transistor or the gates of a set of baseband transistors arranged in parallel and including the baseband transistor to such a voltage that all the input current from the input line is sunk by the baseband transistor or set of baseband transistors.

16. The radio-frequency modulator apparatus of claim 1, comprising a capacitor connected to the output line for providing transient current to the output line.

17. The radio-frequency modulator apparatus of claim 1, wherein the radio-frequency modulator apparatus is a differential modulator apparatus and wherein the baseband stage comprises:
a pair of input lines for receiving a differential input current;
a pair of output lines for outputting a differential output signal to the mixer stage; and
a respective baseband transistor or a respective set of baseband transistors connected to each input line.

18. The radio-frequency modulator apparatus of claim 1, wherein the radio-frequency modulator apparatus is a quadrature modulator apparatus and wherein the baseband stage comprise an in-phase section and a quadrature section, each section comprising a respective baseband transistor of a respective set of baseband transistors.

19. A radio transmitter apparatus of comprising the radio-frequency modulator apparatus of claim 1, and further comprising a power amplifier and an antenna, wherein the power amplifier is arranged to receive and amplify the radio-frequency output current and wherein the antenna is arranged to transmit the amplified radio-frequency output signal as a radio signal.

20. The radio-frequency modulator apparatus of claim 1, wherein the baseband transistor and the radio-frequency transistor have a same voltage gain or current gain.

* * * * *